US008569762B2

(12) United States Patent
Ha et al.

(10) Patent No.: US 8,569,762 B2
(45) Date of Patent: Oct. 29, 2013

(54) ORGANIC LIGHT-EMITTING DISPLAY DEVICE HAVING IMPROVED TRANSMITTANCE

(75) Inventors: Jae-Heung Ha, Yongin (KR);
Kyu-Hwan Hwang, Yongin (KR);
Seok-Gyu Yoon, Yongin (KR);
Young-Woo Song, Yongin (KR);
Jong-Hyuk Lee, Yongin (KR);
Keum-Nam Kim, Yongin (KR);
Young-In Hwang, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 111 days.

(21) Appl. No.: 13/165,567

(22) Filed: Jun. 21, 2011

(65) Prior Publication Data
US 2012/0001184 A1 Jan. 5, 2012

(30) Foreign Application Priority Data

Jul. 2, 2010 (KR) ........................ 10-2010-0063868

(51) Int. Cl.
*H01L 29/04* (2006.01)
(52) U.S. Cl.
USPC .................. 257/59; 257/72; 257/E51.018
(58) Field of Classification Search
USPC .................. 257/59, 72, 40, E51.018
See application file for complete search history.

(56) References Cited

U.S. PATENT DOCUMENTS

2001/0043046 A1* 11/2001 Fukunaga ................ 315/160
2005/0269945 A1 12/2005 Su
2009/0128023 A1* 5/2009 Kwak et al. ............... 313/504

2010/0097295 A1 4/2010 Kwak
2010/0102713 A1 4/2010 Seo et al.
2011/0241563 A1* 10/2011 Kim et al. ................. 315/291

FOREIGN PATENT DOCUMENTS

| JP | 2001-230086 A | 8/2001 |
| JP | 2002-033198 A | 1/2002 |
| JP | 2002-318556 A | 10/2002 |
| JP | 2008-112112 A | 5/2008 |
| JP | 2010-097925 A | 4/2010 |
| KR | 10-2004-0025383 A | 3/2004 |

(Continued)

OTHER PUBLICATIONS

English Translation of KIPO Office action dated Feb. 23, 2012 for priority application KR 10-2010-0063868, 6 pps. (Verification included; 1 pg.).

*Primary Examiner* — Bilkis Jahan
(74) *Attorney, Agent, or Firm* — Christie, Parker & Hale, LLP

(57) ABSTRACT

A transparent organic light-emitting display device has an improved transmittance and a reduced voltage drop in an opposite electrode. The organic light-emitting display device includes: a first substrate having a transmitting region and a plurality of pixel regions separated from each other by the transmitting region interposed between the pixel regions; a plurality of pixel electrodes being located at the pixel regions, respectively; an opposite electrode facing the pixel electrodes and being at the transmitting region and the pixel regions; a second substrate facing the opposite electrode and being bonded to the first substrate; a first conductive unit being between the second substrate and the opposite electrode, opposite ends of the first conductive unit contacting the second substrate and the opposite electrode, respectively; and a second conductive unit facing the first conductive unit and contacting the opposite electrode that is between the first conductive unit and the second conductive unit.

20 Claims, 14 Drawing Sheets

(56) References Cited

FOREIGN PATENT DOCUMENTS

| KR | 10-2005-0017695 A | 2/2005 |
| KR | 10-2005-0081540 A | 8/2005 |
| KR | 10-2007-0078599 A | 8/2007 |
| KR | 10-2009-0016238 A | 2/2009 |
| KR | 10-2010-0047457 A | 5/2010 |

* cited by examiner

ORGANIC LIGHT-EMITTING DISPLAY DEVICE HAVING IMPROVED TRANSMITTANCE

CROSS-REFERENCE TO RELATED PATENT APPLICATION

This application claims priority to and the benefit of Korean Patent Application No. 10-2010-0063868, filed on Jul. 2, 2010, in the Korean Intellectual Property Office, the disclosure of which is incorporated herein in its entirety by reference.

BACKGROUND

1. Field

Aspects of embodiments according to the present invention relate to an organic light-emitting display device, and more particularly, to a transparent organic light-emitting display device.

2. Description of the Related Art

Applications of organic light-emitting display devices range from personal portable devices, such as MP3 players and mobile phones, to television sets due to having superior characteristics such as wide viewing angles, high contrast ratios, fast response times, and low power consumption.

An organic light-emitting display device has self light-emitting characteristics, and the weight and thickness of the organic light-emitting display device can be reduced since the organic light-emitting display device does not require an additional light source, unlike a liquid crystal display device.

Also, the organic light-emitting display device can be formed to be a transparent display device by having transparent thin film transistors and transparent organic light-emitting devices.

In a transparent display device according to the related art, when the device is in an off-state, an object or an image at a side of the device opposite to the user is viewable to the user through not only organic light-emitting devices but also through patterns of thin film transistors and various wires and through spaces between the patterns of the thin film transistors and various wires. In the above-described transparent display device, the transmittances of the organic light-emitting devices, the thin film transistors, and the wires are not so high, and spaces between the organic light-emitting devices, the thin film transistor, and the wires are very small, and thus, the transmittance of the transparent display device is not high.

Also, an image viewable to the user may be distorted due to the above-described patterns, i.e., the patterns of the organic light-emitting devices, the thin film transistors, and the wires. The reason for this is because gaps between the patterns are only a few nanometers, that is, at a level close to the wavelengths of visible light, and thus, the gaps scatter light passing therethrough.

Furthermore, when an opposite electrode to be commonly deposited on the entire screen is formed with a small thickness in order to improve the transmittance of external light, a voltage drop, i.e., an IR drop, may occur at the opposite electrode, and in particular, as the size of an organic light-emitting display device is increased, the voltage drop may be significant.

SUMMARY

Aspects of embodiments according to the present invention are directed toward a transparent organic light-emitting display device having an improved transmittance and a reduced voltage drop in an opposite electrode.

Aspects of embodiments according to the present invention are also directed toward a transparent organic light-emitting display device that prevents or reduces distortion of an image transmitted therethrough by preventing or reducing light transmitting therethrough from scattering.

According to an embodiment of the present invention, there is provided an organic light-emitting display device including: a first substrate having a transmitting region and a plurality of pixel regions separated from each other by the transmitting region interposed between the pixel regions; a plurality of thin film transistors on the first substrate and being at the pixel regions of the substrate, respectively; a passivation layer covering the plurality of thin film transistors; a plurality of pixel electrodes on the passivation layer being electrically coupled to the thin film transistors, respectively, the plurality of pixel electrodes being at the pixel regions, respectively, and overlapping and covering the thin film transistors, respectively; an opposite electrode facing the pixel electrodes and at the transmitting region and the pixel regions; an organic emission layer interposed between a corresponding one of the pixel electrodes and the opposite electrode for emitting light; a second substrate facing the opposite electrode and being bonded to the first substrate; a first conductive unit being interposed between the second substrate and the opposite electrode, opposite ends of the first conductive unit contacting the second substrate and the opposite electrode, respectively, and the first conductive unit including a conductive material; and a second conductive unit facing the first conductive unit and contacting the opposite electrode, the second conductive unit including a conductive material, the opposite electrode being interposed between the first conductive unit and the second conductive unit.

Each of the pixel electrodes may have an area substantially identical to that of a corresponding one of the pixel regions.

The organic light-emitting display device may further include a plurality of conductive lines electrically coupled to the thin film transistors, respectively, wherein at least one of the conductive lines overlaps at least one of the pixel electrodes.

A ratio of an area of the transmitting region with respect to a total area of the pixel regions and the transmitting region may be between 5% and 90%.

The passivation layer may be formed on both the transmitting region and the pixel regions and may include a transparent material.

At least portions of the first conductive unit and the second conductive unit may overlap the transmitting region.

The first conductive unit may be on a surface of the second substrate that faces the opposite electrode.

The organic light-emitting display device may further include an insulating layer on the passivation layer, the insulating layer covering edges of the pixel electrodes, wherein the second conductive unit is on the insulating layer.

The opposite electrode may have a transmission window in at least a portion of a region corresponding to the transmitting region, wherein the first conductive unit and the second conductive unit are adjacent to the transmission window.

The pixel electrodes may be reflective electrodes.

According to another embodiment of the present invention, there is provided an organic light-emitting display device including: a first substrate having a transmitting region and a plurality of pixel regions separated from each other by the transmitting region interposed between the pixel regions; a plurality of pixel circuits on the first substrate, wherein each of the pixel circuits includes at least one thin film transistor, and the plurality of pixel circuits are at the pixel regions, respectively; a first insulating layer covering the pixel circuits; a plurality of pixel electrodes on the first insulating layer being electrically coupled to the pixel circuits, respectively, and overlapping and covering the pixel circuits, respectively; an opposite electrode facing the pixel electrodes and being at the transmitting region and the pixel regions; an organic emission layer interposed between a corresponding one of the pixel electrodes and the opposite electrode for emitting light; a second substrate facing the opposite electrode and being bonded to the first substrate; a first conductive unit interposed between the second substrate and the opposite electrode having opposite ends contacting the second substrate and the opposite electrode, respectively, and the first conductive unit including a conductive material; and a second conductive unit facing the first conductive unit and contacting the opposite electrode, the second conductive unit including a conductive material, the opposite electrode being interposed between the first conductive unit and the second conductive unit.

Each of the pixel electrodes may be at a same region as a corresponding one of the pixel regions.

The organic light-emitting display device may further include a plurality of conductive lines electrically coupled to the pixel circuits, respectively, wherein at least one of the conductive lines crosses at least one of the pixel regions.

A ratio of an area of the transmitting region with respect to a total area of the pixel regions and the transmitting region may be between 5% and 90%.

The first insulating layer and a plurality of second insulating layers may be on both the transmitting region and the pixel regions and may include a transparent material.

At least portions of the first conductive unit and the second conductive unit may overlap the transmitting region.

The first conductive unit may be on a surface of the second substrate that faces the opposite electrode.

The organic light-emitting display device may further include a second insulating layer on the first insulating layer, the second insulating layer covering edges of the pixel electrodes, wherein the second conductive unit is on the second insulating layer.

The opposite electrode may have a transmission window formed in at least a portion of a region corresponding to the transmitting region, wherein the first conductive unit and the second conductive unit are adjacent to the transmission window.

The pixel electrodes may be reflective electrodes.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

The present invention will now be described more fully with reference to the accompanying drawings in which exemplary embodiments of the invention are shown.

Figure 1:
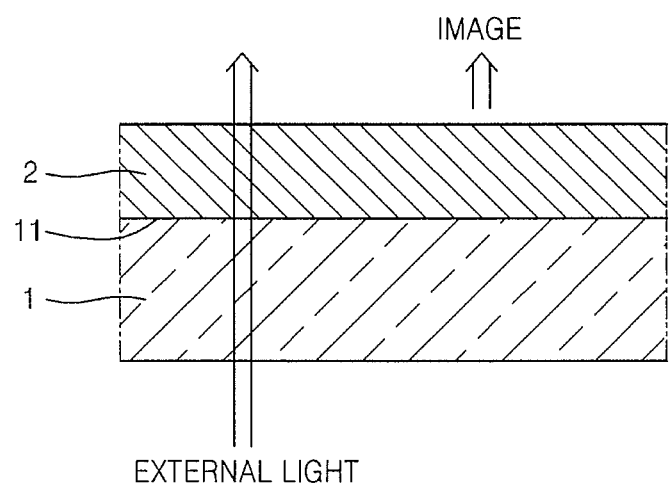
FIG. 1 is a cross-sectional view of an organic light-emitting display device according to an embodiment of the present invention.

FIG. 1 is a cross-sectional view of an organic light-emitting display device according to an embodiment of the present invention.

Referring to FIG. 1, the organic light-emitting display device according to an embodiment of the present invention includes a display unit 2 formed on a first surface 11 of a first substrate 1.

In the organic light-emitting display device, external light enters through the first substrate 1 and the display unit 2.

As will be described in more detail later, the display unit 2 is formed to allow external light to transmit therethrough. That is, referring to FIG. 1, the display unit 2 is formed in such a way that a user at a side where an image is displayed can observe an external image through the first substrate 1.

Figure 2:
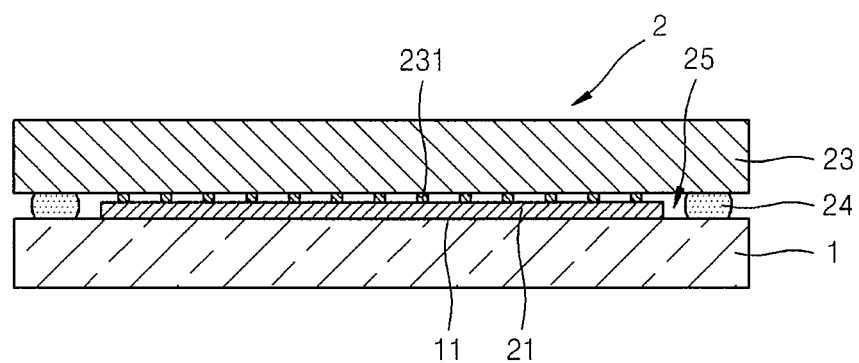
FIG. 2 is an enlarged cross-sectional view showing the organic light-emitting display device of FIG. 1.

FIG. 2 is an enlarged cross-sectional view specifically showing the organic light-emitting display device of FIG. 1. The display unit 2 includes an organic light-emitting unit 21 formed on the first surface 11 of the first substrate 1 and a second substrate 23 to seal the organic light-emitting unit 21.

The second substrate 23 may be formed of a transparent material to allow viewing of an image generated by the organic light-emitting unit 21 and to prevent external air and moisture from penetrating into the organic light-emitting unit 21.

Edge portions of the first substrate 1 and the second substrate 23 are sealed by a sealant 24, and thus, a space 25 is formed between the first substrate 1 and the second substrate 23. As will be described in more detail later, a first conductive unit 231 is disposed in the space 25. The space 25 may be filled with a filler.

Figure 3:
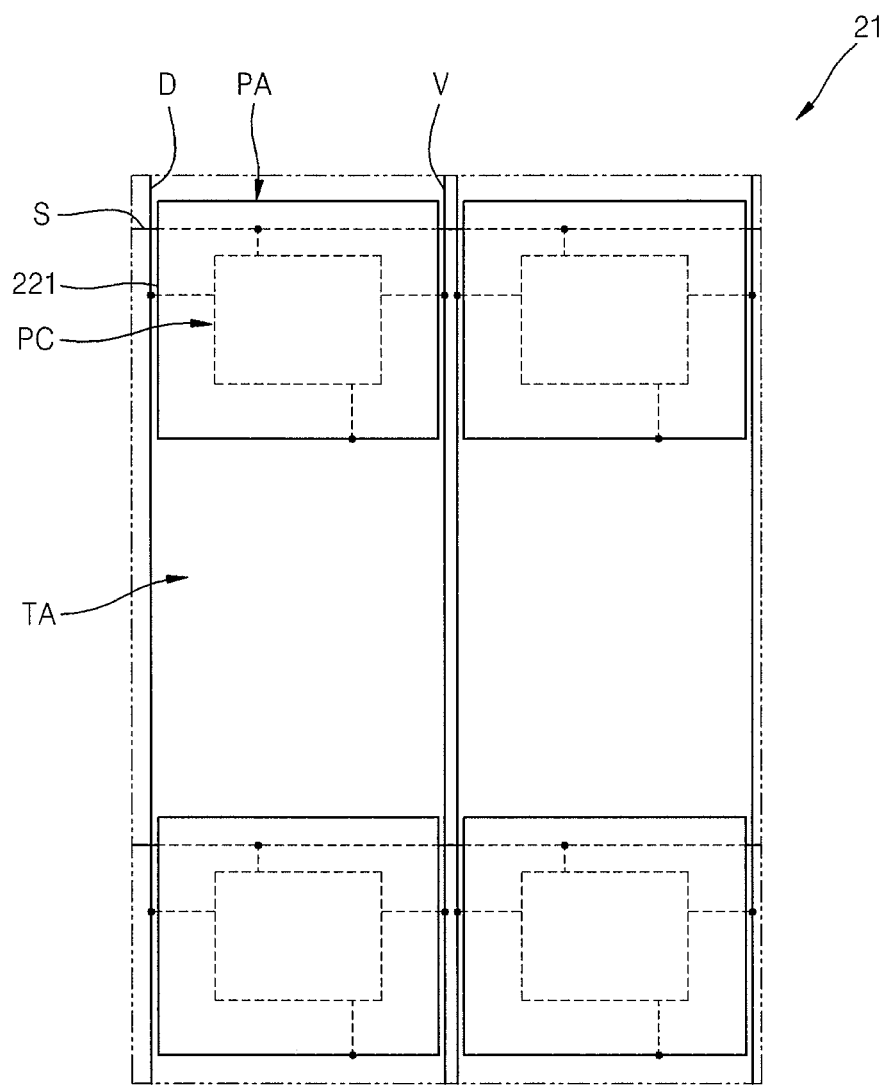
FIG. 3 is a schematic diagram showing an organic light-emitting unit of the organic light-emitting display device of FIG. 1, according to an embodiment of the present invention.
Figure 4:
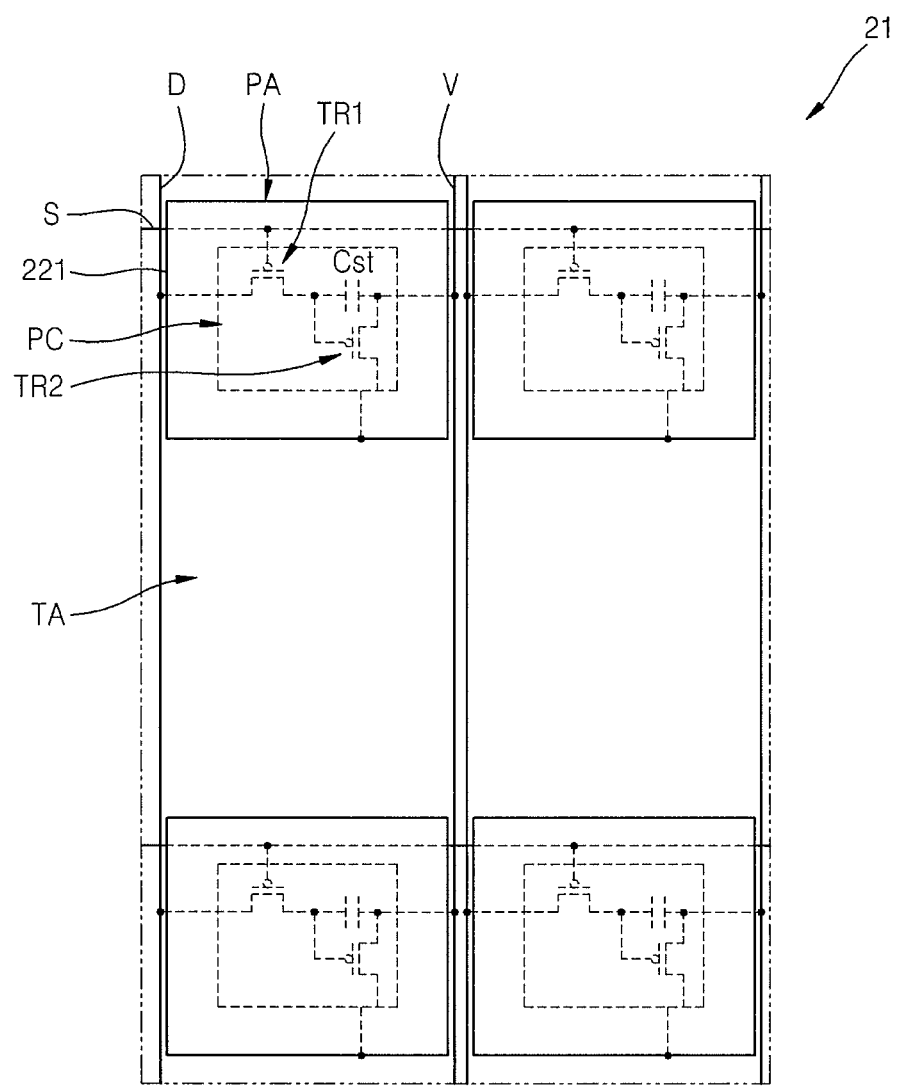
FIG. 4 is a schematic diagram showing a pixel circuit of the organic light-emitting unit of FIG. 3, according to an embodiment of the present invention.

FIG. 3 is a schematic diagram showing the organic light-emitting unit 21 of FIG. 2, according to an embodiment of the present invention, and FIG. 4 is a schematic diagram showing a pixel circuit PC of the organic light-emitting unit 21, according to an embodiment of the present invention. Referring to FIGS. 2 through 4, according to an embodiment of the present invention, the organic light-emitting unit 21 is formed on the first substrate 1 on which transmitting regions TA for transmitting external light and a plurality of pixel regions PA separated from each other and having the transmitting regions TA interposed therebetween are defined.

Each of the pixel regions PA includes the pixel circuit PC and a plurality of conductive lines, such as a scan line S, a data line D, and a driving power line V, that are electrically coupled to the pixel circuit PC. Although not shown, various other conductive lines, besides the scan line S, the data line D, and the driving power line V, may further be coupled to the pixel circuit PC according to the configuration of the pixel circuit PC.

As shown in FIG. 4, the pixel circuit PC includes a first thin film transistor TR1 coupled to the scan line S and the data line D, a second thin film transistor TR2 coupled to the first thin film transistor TR1 and the driving power line V, and a capacitor Cst coupled to the first and second thin film transistors TR1 and TR2. The first thin film transistor TR1 is a switching transistor, and the second thin film transistor TR2 is a driving transistor. The second thin film transistor TR2 is electrically coupled to a pixel electrode 221. In FIG. 4, the first and second thin film transistors TR1 and TR2 are P-type transistors, but are not limited thereto, and at least one of the first and second thin film transistors TR1 and TR2 may be an N-type transistor. The number of thin film transistors and the number of capacitors are not limited to the number shown in FIGS. 3 and 4, and for example, two or more thin film transistors and one or more capacitors may be combined with each other in the pixel circuit PC, according to embodiments of the present invention.

In FIGS. 3 and 4, the scan line S overlaps the pixel electrode 221. However, the present invention is not limited thereto. At least one of the plurality of conductive lines including the scan line S, the data line D, and the driving power line V, may overlap the pixel electrode 221. In some embodiments, all of the plurality of conductive lines, including the scan line S, the data line D, and the driving power line V, may overlap the pixel electrode 221 or may be disposed beside the pixel electrode 221.

The pixel regions PA are light-emitting regions. Since the pixel circuit PC is located in the light-emitting region, the user can see the outside through the transmitting regions TA. In this way, a region where the image is displayed is divided into the pixel regions PA and the transmitting regions TA, and the conductive patterns, which are one of the main factors causing lowering of the overall transmittance of the transparent organic light-emitting display device, are mostly located in the pixel regions PA to increase the transmittance of the transmitting regions TA so that the transmittance of the region where the image is displayed is improved, as compared to the transmittance of a conventional transparent display device.

In addition, the above-described organic light-emitting unit 21 prevents or reduces external image distortion that occurs when the user observes the outside through the transmitting regions TA of the region where the image is displayed, which is divided into the pixel regions PA and the transmitting regions TA, as described above, due to scattering of external light caused by interference with the patterns of internal elements of the pixel circuit PC.

Although the conductive lines, including the scan line S, data line D, and driving power line V, cross the transmitting region TA between the pixel regions PA, since the conductive lines are formed to be very thin, the conductive lines are hardly seen by the user and have little effect on the overall transmittance of the organic light-emitting unit 21, and accordingly, a transparent display is realized. Also, although the user may not see much of an external image in regions covered by the pixel regions PA, in consideration of the overall display region, there is little effect on observing the external image since the pixel regions PA appear like a plurality of dots regularly arranged on a surface of a transparent glass.

The transmitting regions TA and the pixel regions PA are formed in such a way that a ratio of the area of the transmitting regions TA with respect to the overall area of the transmitting regions TA and the pixel regions PA is between 5% and 90%.

If the ratio of the area of the transmitting regions TA with respect to the overall area of the transmitting regions TA and the pixel regions PA is less than 5%, with respect to FIG. 1, the user can hardly see an object or image on a side opposite to the user due to the lack of light that can transmit through the display unit 2 when the display 2 unit is in an off-state. That is, the display unit 2 is not transparent. In one embodiment, although the ratio of the area of the transmitting regions TA with respect to the overall area of the transmitting regions TA and the pixel regions PA may be approximately 5%, the pixel regions PA are arranged in an island state with respect to the transmitting regions TA, such that scattering of light (e.g., solar light) is minimized or reduced since substantially all conductive patterns are disposed across the pixel regions PA, and thus, the user may recognize the display unit 2 as a transparent display unit. As will be described in more detail later, when a transistor included in the pixel circuit PC is formed of a transparent thin film transistor (TFT), such as a transistor based an oxide semiconductor, and an organic light-emitting device is a transparent device, the user may further recognize the display unit 2 as a transparent display unit.

If the ratio of the area of the transmitting regions TA with respect to the entire area of the pixel regions PA and the transmitting regions TA is greater than 90%, pixel integrity of the display unit 2 is excessively reduced, and thus, a stable image can hardly be realized through the light emission from the pixel regions PA. That is, as the area of the pixel regions PA is reduced, the amount of light emitted from an organic emission layer that will be described in more detail later must be increased in order to realize an image. However, if the organic light-emitting device is operated to emit light having a high brightness, the lifetime of the organic light-emitting device is rapidly reduced. Also, when the ratio of the area of the transmitting regions TA with respect to the entire area of the pixel regions PA and the transmitting regions TA is greater than 90% and the size of a single pixel region PA is maintained at an appropriate size, the number of pixel regions PA is reduced, and accordingly, the resolution of the organic light-emitting device is reduced.

In some embodiments, the ratio of the area of the transmitting regions TA with respect to the entire area of the pixel regions PA and the transmitting regions TA may be between 20% and 70%.

When the ratio of the area of the transmitting regions TA with respect to the entire area of the pixel regions PA and the transmitting regions TA is less than 20%, the ratio of the area of the pixel regions PA with respect to the area of the transmitting regions TA is excessively high. Therefore, it limits the user's ability to observe an external image through the transmitting regions TA. When the ratio of the area of the transmitting regions TA with respect to the entire area of the pixel regions PA and the transmitting regions TA exceeds 70%, there are a lot of limitations in designing the pixel circuit PC.

Each of the pixel regions PA includes the pixel electrode 221 that has an area corresponding to the area of the pixel region PA and is electrically coupled to the pixel circuit PC. The pixel circuit PC overlaps with the pixel electrode 221 so that the pixel circuit PC is covered by the pixel electrode 221. Also, the conductive lines, including the scan line S, the data line D, and the driving power line V, cross the pixel electrode 221. According to an embodiment of the present invention, the pixel electrode 221 may have an area equal to or slightly greater than that of the pixel region PA. Accordingly, as shown in FIG. 4, when the user observes the organic light-emitting unit 21, the pixel circuit PC described above is covered by the pixel electrode 221, and the conductive lines are also mostly covered. Therefore, since the user sees only a portion of the conductive lines through the transmitting regions TA, the overall transmittance of the transparent organic light-emitting display device is improved as described above, and thus, the user can see an external image through the transmitting regions TA.

Figure 5:
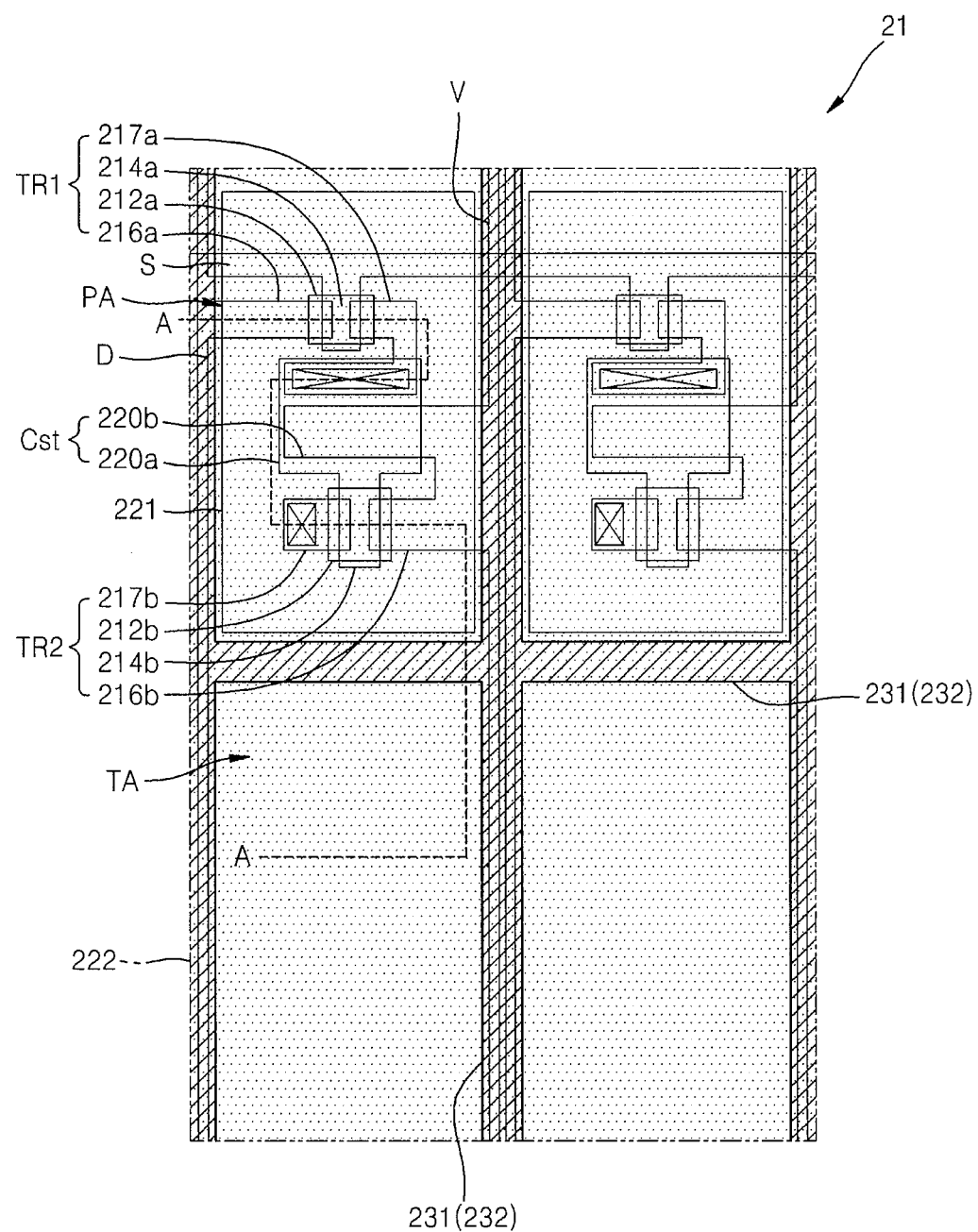
FIG. 5 is a schematic plan view showing the organic light-emitting unit of the organic light-emitting display device of FIG. 1.
Figure 6:
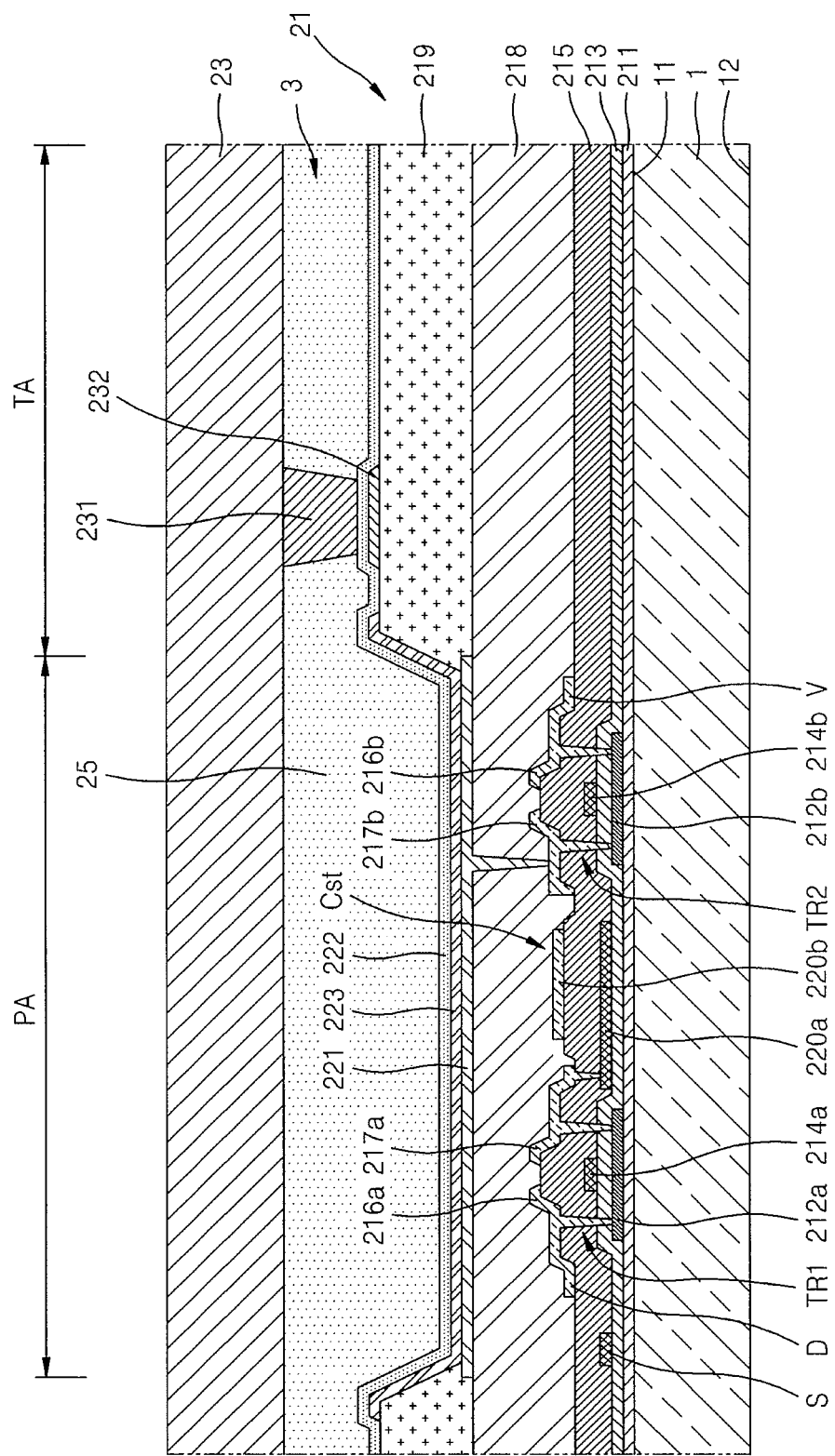
FIG. 6 is a cross-sectional view taken along the line A-A of FIG. 5.

FIGS. 5 and 6 are a plan view and a cross-sectional view showing the organic light-emitting unit 21 of FIG. 4 and the pixel circuit PC of FIG. 4 in more detail, respectively.

According to an embodiment of the present invention, in the organic light-emitting unit 21 of FIGS. 5 and 6, a buffer layer 211 (shown in FIG. 6) is formed on the first surface 11 of the first substrate 1, and the first thin film transistor TR1, the capacitor Cst, and the second thin film transistor TR2 are formed on the buffer layer 211.

First, a first semiconductor active layer 212a and a second semiconductor active layer 212b are formed on the buffer layer 211.

The buffer layer 211 prevents impurity elements from penetrating into the organic light-emitting unit 21 and planarizes a surface of the organic light-emitting unit 21. The buffer layer 211 may be formed of any of various suitable materials that can perform the functions described above. For example, the buffer layer 211 may be formed of an inorganic material, such as silicon oxide, silicon nitride, silicon oxynitride, aluminum oxide, aluminum nitride, titanium oxide, or titanium nitride, or an organic material, such as polyimide, polyester, acryl, or stacks of these materials. In some embodiments, the buffer layer 211 may not be formed.

The first and second semiconductor active layers 212a and 212b may be formed of polycrystal silicon, but are not limited thereto, and may be formed of an oxide semiconductor. For example, the first and second semiconductor active layers 212a and 212b may be G-I-Z-O layers [$(In_2O_3)_a(Ga_2O_3)_b(ZnO)_c$ layer] (where a, b, and c are integers that respectively satisfy a≥0, b≥0, and c>0). When the first and second semiconductor active layers 212a and 212b are formed of an oxide semiconductor, optical transmittance can further be increased.

A gate insulating layer 213 (shown in FIG. 6), covering the first and second semiconductor active layers 212a and 212b, is formed on the buffer layer 211, and first and second gate electrodes 214a and 214b are formed on the gate insulating layer 213.

An interlayer insulating layer 215 (shown in FIG. 6) is formed on the gate insulating layer 213 to cover the first and second gate electrodes 214a and 214b. A first source electrode 216a, a first drain electrode 217a, a second source electrode 216b and a second drain electrode 217b are formed on the interlayer insulating layer 215. The first source electrode 216a and the first drain electrode 217a are coupled to the first semiconductor active layer 212a, and the second source electrode 216b and the second drain electrode 217b are coupled to the second semiconductor active layer 212b through contact holes formed in the interlayer insulating layer 215.

In FIG. 6, the scan line S may be concurrently (e.g., simultaneously) formed with the first and second gate electrodes 214a and 214b. The data line D may be concurrently (e.g., simultaneously) formed with the first source electrode 216a and coupled to the first source electrode 216a. The driving power line V may be concurrently (e.g., simultaneously) formed with the second source electrode 216b and coupled to the second source electrode 216b.

As to the capacitor Cst, a lower electrode 220a is concurrently (e.g., simultaneously) formed with the first and second gate electrodes 214a and 214b, and an upper electrode 220b is concurrently (e.g., simultaneously) formed with the first drain electrode 217a.

The structures of the first thin film transistor TR1, the capacitor Cst, and the second thin film transistor TR2 are not limited thereto, and any of various suitable types of thin film transistor and capacitor structures may be employed.

A passivation layer 218 (shown in FIG. 6) is formed to cover the first thin film transistor TR1, the capacitor Cst, and the second thin film transistor TR2. The passivation layer 218 may be a single layer or a number of insulating layers, upper surfaces of which are planarized, and may be each formed of an inorganic material or an organic material.

The pixel electrode 221, covering the first thin film transistor TR1, the capacitor Cst, and the second thin film transistor TR2, may be formed on the passivation layer 218, as shown in FIGS. 5 and 6. The pixel electrode 221 is coupled to the second drain electrode 217b of the second thin film transistor TR2 through a via-hole formed in the passivation layer 218. As shown in FIG. 5, the pixel electrode 221 is formed as an independent island type of electrode in each pixel.

A pixel defining layer 219 (shown in FIG. 6), covering edges of the pixel electrode 221, is formed on the passivation layer 218. An organic emission layer 223 (shown in FIG. 6) and an opposite electrode 222 are sequentially formed on the pixel electrode 221 in the stated order. The opposite electrode 222 is formed on all the pixel regions PA and the transmitting regions TA.

The organic emission layer 223 may be a low-molecular weight organic layer or a polymer organic layer. When the organic emission layer 223 is a low-molecular weight organic layer, the organic emission layer 223 may be formed by stacking a hole injection layer (HIL), a hole transport layer (HTL), an emission layer (EML), an electron transport layer (ETL), and an electron injection layer (EIL) in a single structure or a composite structure, and may be formed of any of various suitable materials such as copper phthalocyanine (CuPc), N,N'-Di(naphthalene-1-yl)-N,N'-diphenyl-benzidine (NPB), or tris-8-hydroxyquinoline aluminum (Alq3). The low-molecular weight organic layer may be formed by vacuum deposition. The HIL, the HTL, the ETL, and the EIL are common layers and may be commonly applied to red, green, and blue pixels. Accordingly, unlike the organic emission layer 223 in FIG. 6, the common layers may be formed to cover the pixel regions PA and the transmitting regions TA, like the opposite electrode 222.

The pixel electrode 221 functions as an anode electrode, and the opposite electrode 222 functions as a cathode electrode. In some embodiments, the polarities of the pixel electrode 221 and the opposite electrode 222 may be reversed.

The pixel electrode 221 is formed to have a size corresponding to the pixel region PA in each pixel. If a region covered by the pixel defining layer 219 does not include the pixel electrode 221, the pixel electrode 221 has an area identical to that of one of the pixel regions PA. The opposite electrode 222 is formed as a common electrode to cover all the pixels of the organic light-emitting unit 21.

According to an embodiment of the present invention, the pixel electrode 221 may be a reflective electrode and the opposite electrode 222 may be a transparent electrode. Thus, the organic light-emitting unit 21 is a top emission type in which an image is displayed in a direction toward the opposite electrode 222.

To this end, the pixel electrode 221 may include a reflective film formed of silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or a compound of these materials, or an oxide having a high work function such as ITO, IZO, ZnO, or $In_2O_3$. The opposite electrode 222 may be formed of a metal having a low work function, such as Ag, Mg, Al, Pt, Pd, Au, Ni, Nd, Ir, Cr, Li, or Ca, or an alloy thereof. The opposite electrode 222 may be formed as a thin film so as to increase a transmittance of external light.

When the pixel electrode 221 is a reflective electrode, a pixel circuit PC disposed under the pixel electrode 221 is covered by the pixel electrode 221. Therefore, referring to FIG. 6, at upper outer sides of the opposite electrode 222, the user cannot observe the first thin film transistor TR1, the capacitor Cst, and the second thin film transistor TR2 disposed under the pixel electrode 221, as well as portions of the scan line S, the data line D, and the driving power line V.

As the pixel electrode 221 is the reflective electrode, light is emitted only towards the user. Thus, the amount of light to be lost in a direction opposite to a direction of the user can be reduced. Also, since the pixel electrode 221 covers various patterns of the pixel circuit PC disposed under the pixel electrode 221, as described above, the user can see a clearer external image.

However, the present invention is not limited thereto, and for example, the pixel electrode 221 may also be a transparent electrode. In one embodiment, the pixel electrode 221 is formed of an oxide having a high work function, such as ITO, IZO, ZnO, or $In_2O_3$, without including the above-described reflective film. If the pixel electrode 221 is transparent, at the upper outer sides of the opposite electrode 222, the user can observe the first thin film transistor TR1, the capacitor Cst, and the second thin film transistor TR2 disposed under the pixel electrode 221, as well as portions of the scan line S, the data line D, and the driving power line V. However, although the pixel electrode 221 is transparent, there is a loss of light since the transmittance of light therethrough is not 100%, and the transmittance of external light is further reduced due to the pixel electrode 221 since the conductive patterns are disposed in the region of the pixel electrode 221. Therefore, interference of the external light due to the conductive patterns is reduced, as compared when the external light directly passes through the conductive patterns, thereby reducing distortion of an external image.

The passivation layer 218, the gate insulating layer 213, the interlayer insulating layer 215, and the pixel defining layer 219 may be formed as transparent insulating layers. The first substrate 1 may have a transmittance smaller or equal to the total transmittance of the transparent insulating layers 218, 213, 215, and 219.

The passivation layer 218 corresponds to a first insulating layer in the claims, and the gate insulating layer 213, the interlayer insulating layer 215, and the pixel defining layer 219 correspond to a plurality of second insulating layers in the claims.

As described above, since the opposite electrode 222 is formed of metal in the shape of a thin film so as to increase a transmittance of external light in the transmitting regions TA and is formed as a common electrode to cover all the pixels of the organic light-emitting unit 21, a sheet resistance of the opposite electrode 222 is increased, and a voltage drop may occur.

In embodiments of the present invention, in order to solve these problems; the organic light-emitting display device of FIG. 5 further includes a first conductive unit 231 that is interposed between the second substrate 23 and the opposite electrode 222, and has one end contacting the second substrate 23 and the other end contacting the opposite electrode 222.

The first conductive unit 231 is interposed between the second substrate 23 and the opposite electrode 222. The first conductive unit 231 may be formed on a surface of the second substrate 23 that faces the opposite electrode 222 to contact the opposite electrode 222 as the second substrate 23 is bonded to the first substrate 1.

The first conductive unit 231 may be formed of metal having high electrical conductivity. As shown in FIG. 6, the first conductive unit 231 may be disposed to correspond to the transmitting regions TA. The first conductive unit 231 may be formed at a boundary between the transmitting regions TA and the pixel regions PA formed at edges of the organic light-emitting unit 21, as shown in FIG. 5, so as to prevent lowering of the transmittance of the transmitting regions TA to a maximum due to the first conductive unit 231.

Figure 7A:
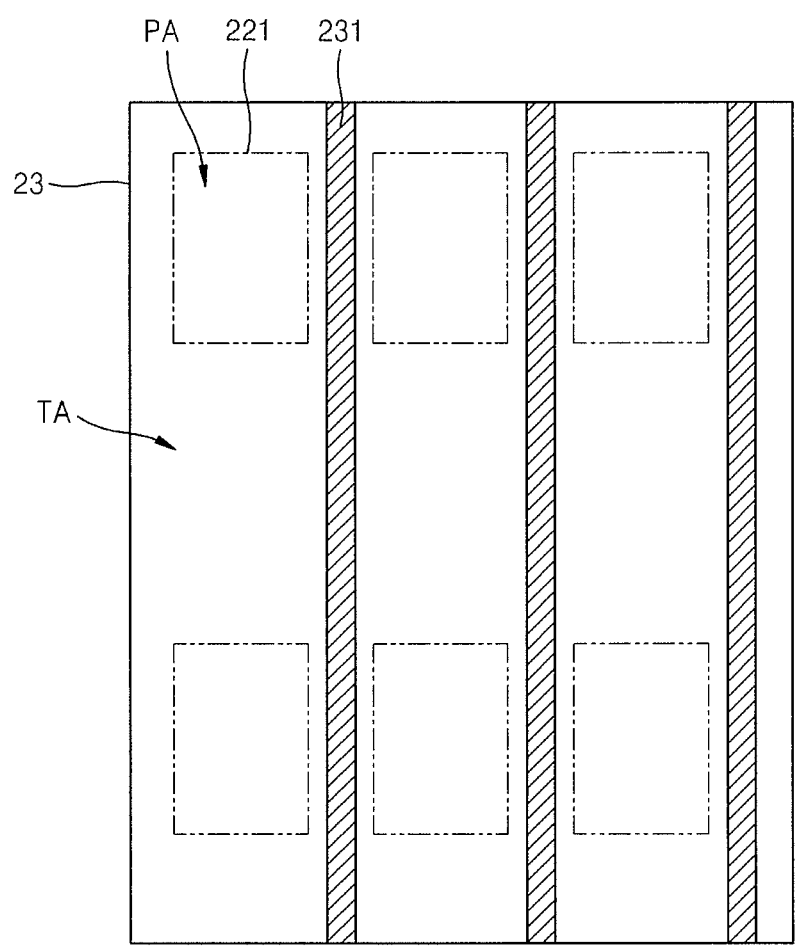
FIGS. 7A, 7B and 7C are plan views showing a first conductive unit of FIG. 6, according to embodiments of the present invention.
Figure 7B:
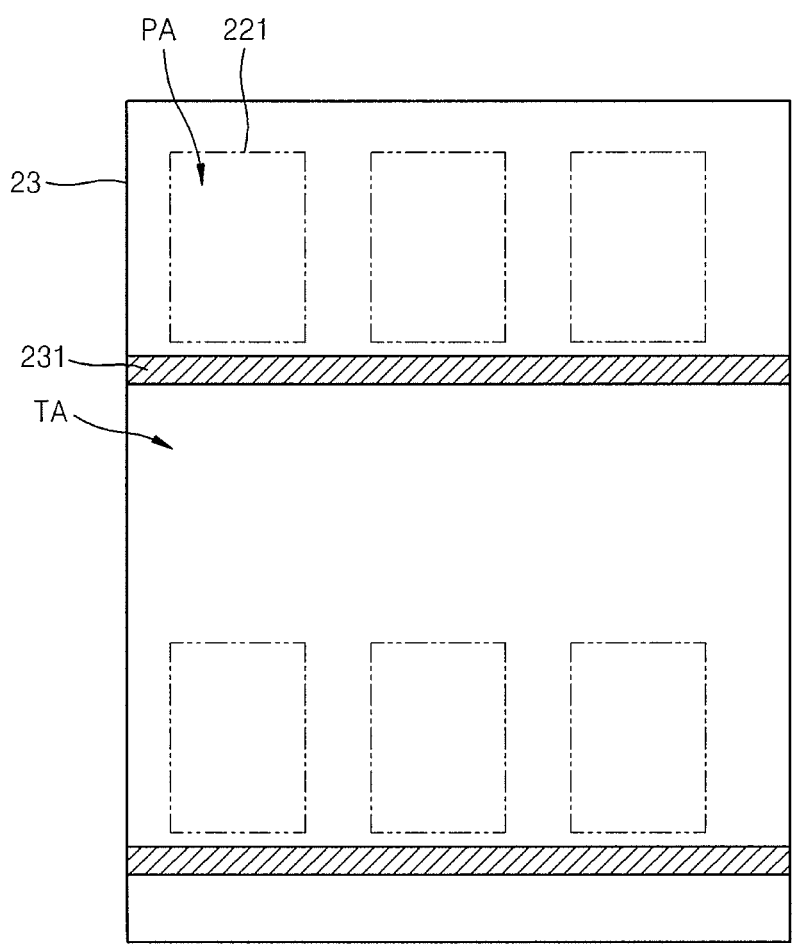
Figure 7C:
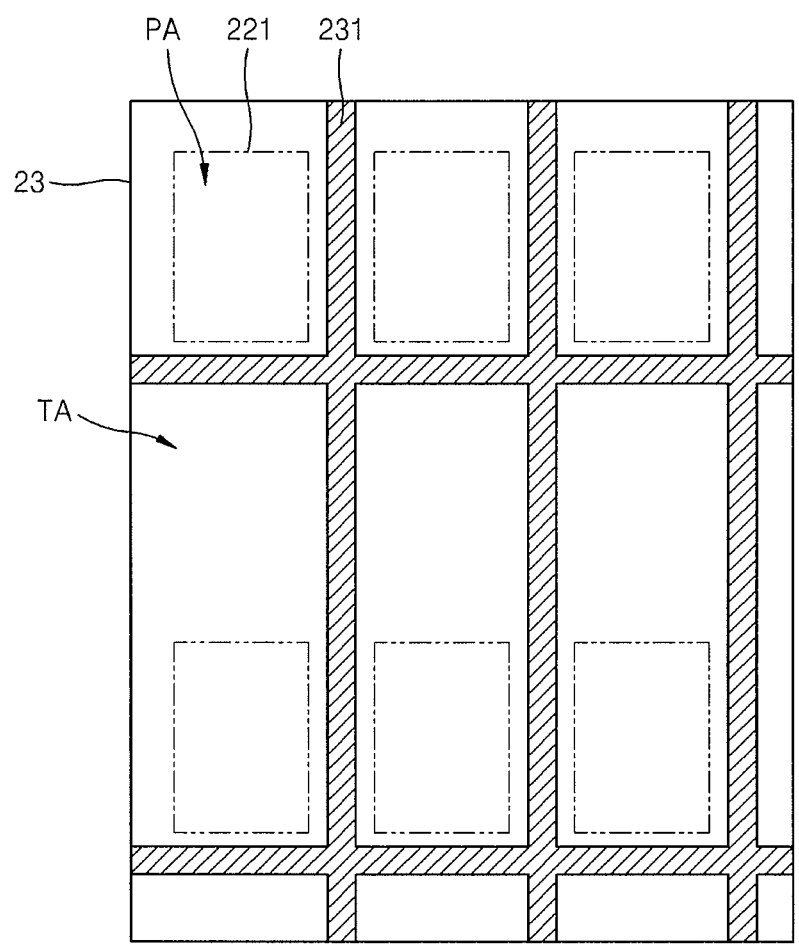

The first conductive unit 231 may be formed on a surface of the second substrate 23 that faces the opposite electrode 222, and for example, may be formed in a straight line in parallel to the data line D, as shown in FIG. 7A, or in a straight line in parallel to the scan line S, as shown in FIG. 7B. In addition, as shown in FIG. 7C, the first conductive unit 231 may be formed as a combination of straight lines in parallel to the data line D and the scan line S, respectively.

The space 25 between the second substrate 23 and the opposite electrode 222 may be filled with a filler 3.

The filler 3 may have a buffering effect in the space 25 between the second substrate 23 and the opposite electrode 222 and may also have an absorption function by further including an absorbent.

The filler 3 is formed in such a way that a liquid material having a suitable viscosity is dropped on a surface of the second substrate 23 or the opposite electrode 222, then the first substrate 1 and the second substrate 23 are bonded to each other. Here, the liquid material flows into the space 25 and is spread therein such that the liquid material fills the space 25. After filling is completed, the filler 3 is cured by ultraviolet (UV) rays or the like.

However, as described above, the first conductive unit 231 is interposed between the second substrate 23 and the opposite electrode 222, and both (opposite) ends of the first conductive unit 231 contact the second substrate 23 and the opposite electrode 222, respectively, when the material for forming the filler 3 flows into the space 25, the material may not sufficiently flow into the space 25 due to the first conductive unit 231.

Figure 8A:
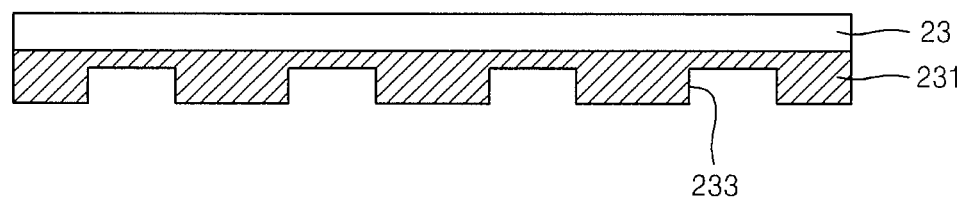
FIGS. 8A, 8B and 8C are cross-sectional views showing the first conductive unit of FIG. 6, according to embodiments of the present invention.
Figure 8B:
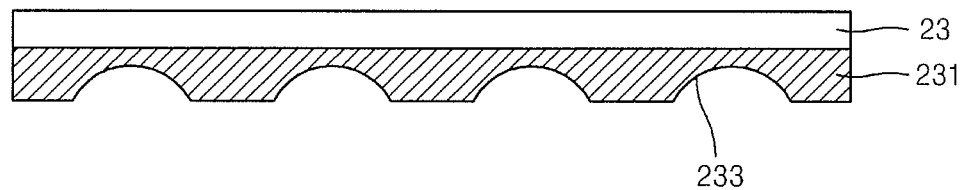
Figure 8C:
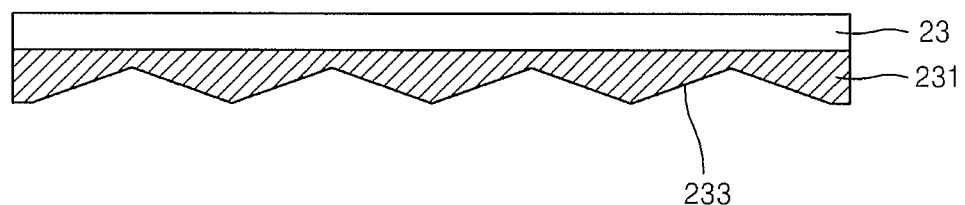

To solve this problem, according to another embodiment of the present invention, inlet portions 233 may be formed on the first conductive unit 231, as shown in FIGS. 8A through 8C.

The inlet portion 233 does not contact the opposite electrode 222. Thus, the filler 3 is interposed between the inlet portion 233 and the opposite electrode 222. In other words, the inlet portion 233 provides a flow path of the material for forming the filler 3.

Thus, even when the first conductive unit 231 is present, the filler 3 may sufficiently fill the space 25.

As shown in FIG. 6, a second conductive unit 232 having the opposite electrode 222 interposed between the first conductive unit 231 and the second conductive unit 232 is disposed facing the first conductive unit 231. The second conductive unit 232 contacts the opposite electrode 222 and is formed of a conductive material. The second conductive unit 232 may be formed on the pixel defining layer 219.

The second conductive unit 232 may be formed in the patterns of the first conductive unit 231 shown in FIGS. 7A through 7C. However, the present invention is not limited thereto, and, in some embodiments, only portions of the second conductive unit 232 may be opposite to the first conductive unit 231.

Since the second conductive unit 232 formed of the conductive material, for example, metal, contacts the opposite electrode 222, a sheet resistance of the opposite electrode 222 may be reduced so as to further prevent a voltage drop in the opposite electrode 222.

Figure 9:
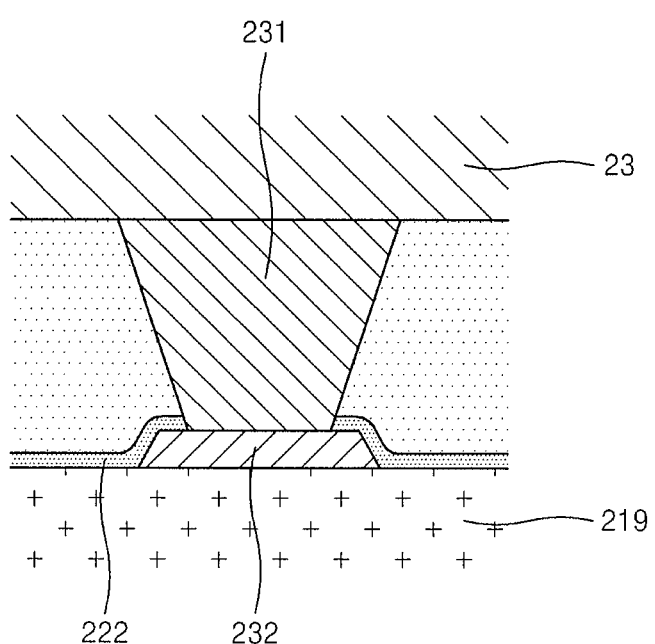
FIG. 9 is a cross-sectional view showing details of the first conductive unit, a second conductive unit, and an opposite electrode of FIG. 6.

Also, the second conductive unit 232 may prevent a problem caused by defects of contact between the opposite electrode 222 and the first conductive unit 231. In more detail, as described above, the first conductive unit 231 is formed on the second substrate 23 in such a way that the first substrate 1 and the second substrate 23 are bonded to each other and the first conductive unit 231 contacts the opposite electrode 222, due to various reasons such as a thickness difference in the first conductive unit 231 and a thickness difference in the sealant 24 for bonding the first substrate 1 and the second substrate 23 to each other, the first conductive unit 231 may damage portions of the opposite electrode 222, as shown in FIG. 9. In this regard, the opposite electrode 222 may be broken, which causes an increase in a sheet resistance of the opposite electrode 222.

According to the present invention, in order to solve this problem, the second conductive unit 232 is further disposed under the opposite electrode 222. In more detail, even when defects of contact between the opposite electrode 222 and the first conductive unit 231 occur, the second conductive unit 232 that contacts the opposite electrode 222 is positioned under the opposite electrode 222 so that contact between the first conductive unit 231, the second conductive unit 232, and the opposite electrode 222 may be maintained in a portion where the second conductive unit 232 and the opposite electrode 222 contact each other.

The first conductive unit 231 and the second conductive unit 232 may cover a plurality of conductive lines of the transmitting regions TA that pass through outside of the pixel regions PA. When the plurality of conductive lines pass through the transmitting regions TA, the effect in which external light is transmitted through multi-slits may be obtained due to patterns of fine conductive lines so that distortion of an external image transmitted therethrough may occur. Thus, due to the first conductive unit 231 and the second conductive unit 232, distortion of the transmitted image may be prevented.

Figure 10:
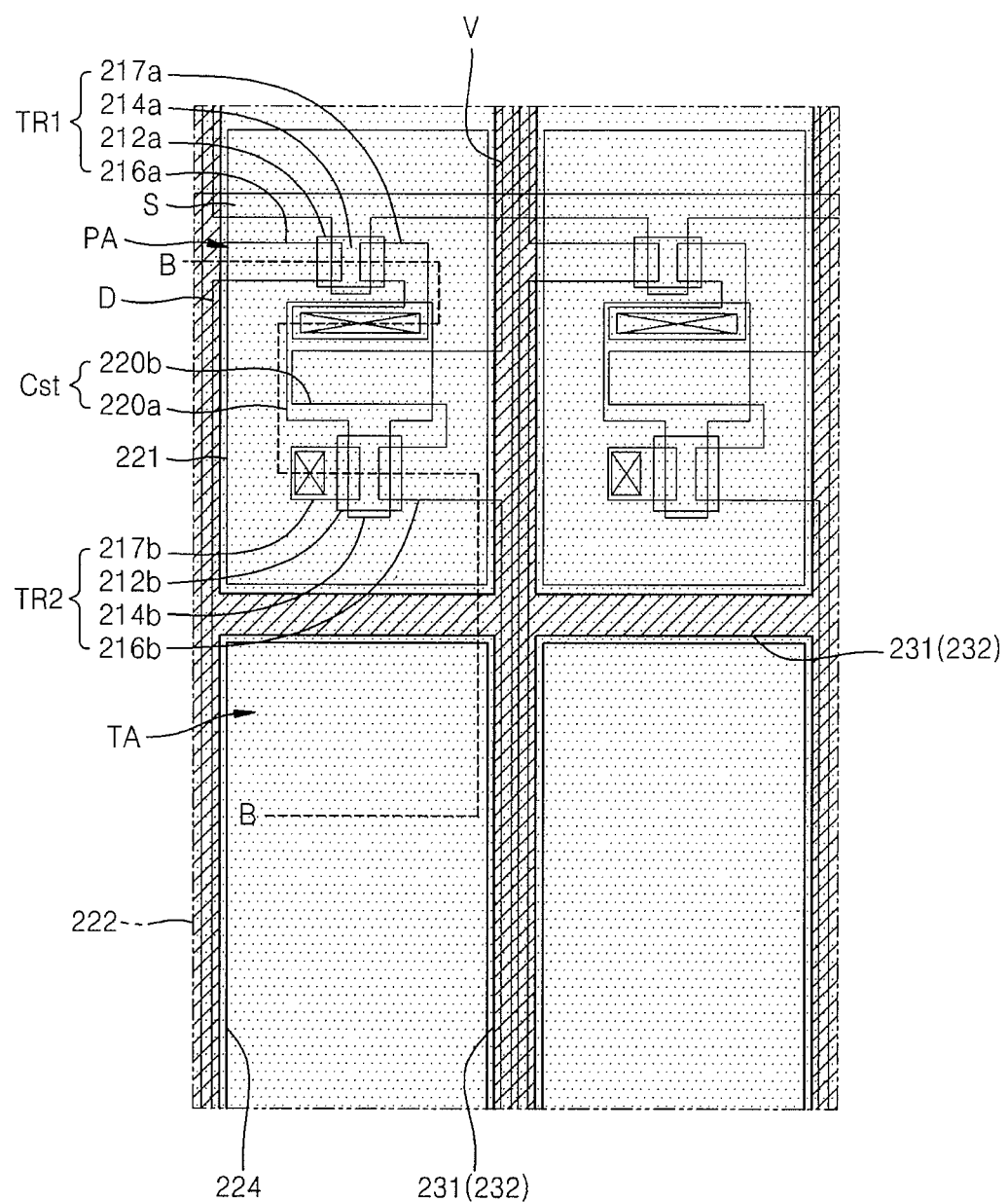
FIG. 10 is a schematic plan view showing the organic light-emitting unit of the organic light-emitting display device of FIG. 1, according to another embodiment of the present invention.
Figure 11:
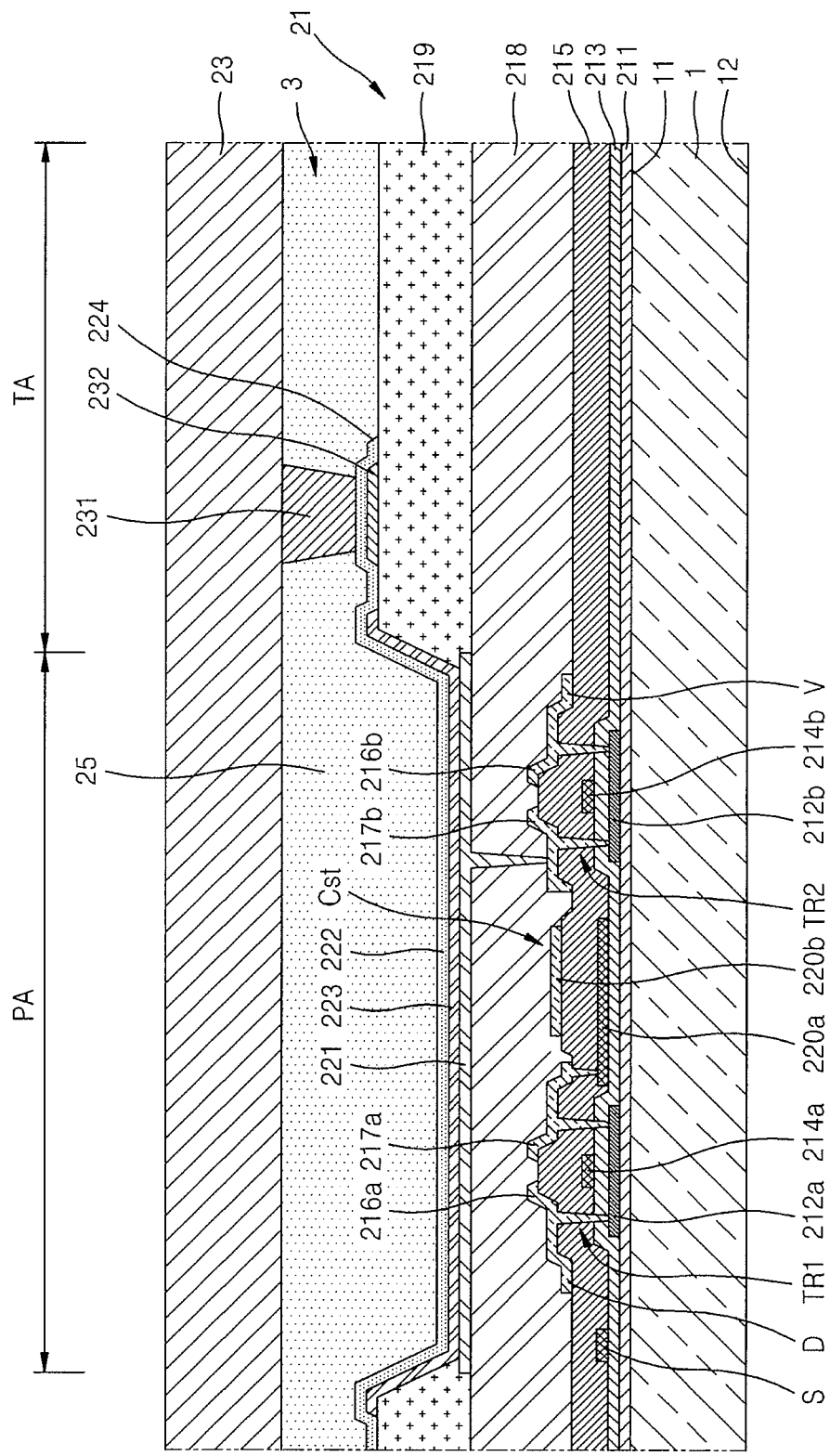
FIG. 11 is a cross-sectional view taken along the line B-B of FIG. 10, according to an embodiment of the present invention.

FIG. 10 is a schematic plan view showing the organic light-emitting unit 21 of the organic light-emitting display device of FIG. 1, according to another embodiment of the present invention, and FIG. 11 is a cross-sectional view taken along the line B-B of FIG. 10.

In FIGS. 10 and 11, a first transmission window 224, through which the opposite electrode 222 is opened, is formed in at least portions of a region corresponding to the transmitting regions TA of the opposite electrode 222.

In order to improve the transmittance of external light in the transmitting regions TA, the area of the transmitting regions TA is increased, or the transmittance of a material deposited in the transmitting regions TA is increased. However, there is a limitation in increasing the area of the transmitting regions TA due to a design of the pixel circuit PC and thus, the transmittance of the material deposited in the transmitting regions TA is increased.

Even in the top emission type in which an image is displayed in a direction toward the opposite electrode 222, the opposite electrode 22 is formed of metal and thus has a limitation in light transmission. When the thickness of the opposite electrode 222 is reduced or the opposite electrode 222 is formed of a conductive metal oxide having high transmittance in order to increase the transmittance of the opposite electrode 222, the resistance of the opposite electrode 222 may be excessively increased.

In order to solve this problem, the first transmission window 224 is formed in the opposite electrode 222 so as to improve the transmittance of external light in the transmitting regions TA.

The first transmission window 224 may be formed in the transmitting regions TA as wide as possible.

Obviously, even in a structure in which the first transmission window 224 is formed, the first conductive unit 231 and the second conductive unit 232 may be formed at the outside of the pixel regions PA that are adjacent to the first transmission window 224.

Figure 12:
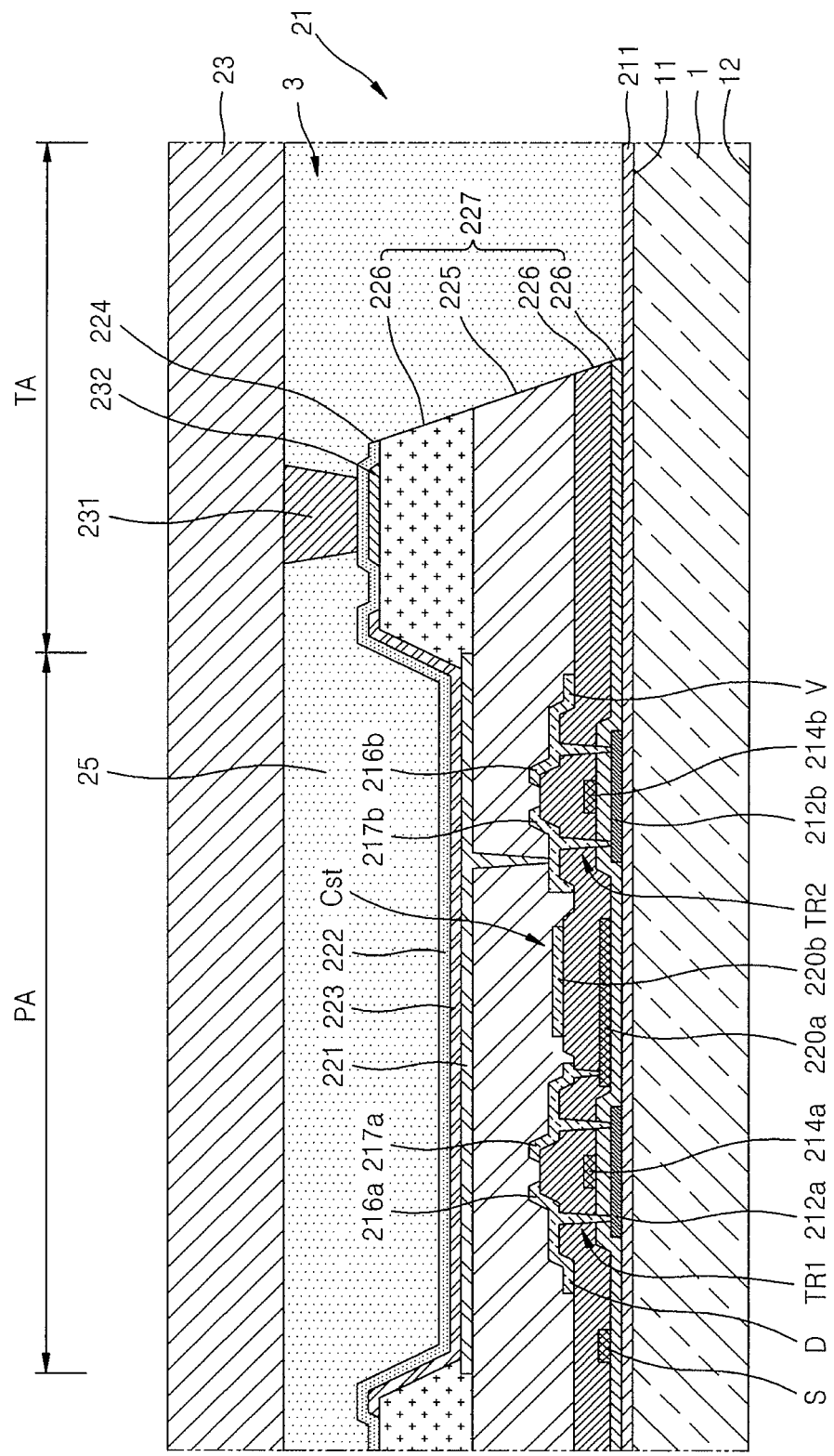
FIG. 12 is a cross-sectional view taken along the line B-B of FIG. 10, according to another embodiment of the present invention.

FIG. 12 illustrates another embodiment of the present invention, wherein an additional transmission window is formed in insulating layers of the transmitting regions TA.

The transmission window may be formed as wide as possible in a region where the transmission window does not interfere with the scan line S, the data line D, and the driving power line V. For example, the transmission window may be formed to be overlapped with the first transmission window 224.

A second transmission window 225 is formed on the passivation layer 218 that covers the pixel circuit PC, and a third transmission window 226 is formed in the gate insulating layer 213, the interlayer insulating layer 215, and the pixel defining layer 219. The second transmission window 225 and the third transmission window 226 constitute a fourth transmission window 227.

In FIG. 12, a transmission window does not extend to the buffer layer 211. The reason for this is to prevent impurity elements from penetrating into an outside of the first substrate 1. In another embodiment, the fourth transmission window 227 may extend to the buffer layer 211.

By forming the fourth transmission window 227 in the transmitting regions TA as well as the first transmission window 224, light transmittance in the transmitting regions TA may be further increased, and thus the user can observe the external image through the first substrate 1 more easily.

Figure 13:
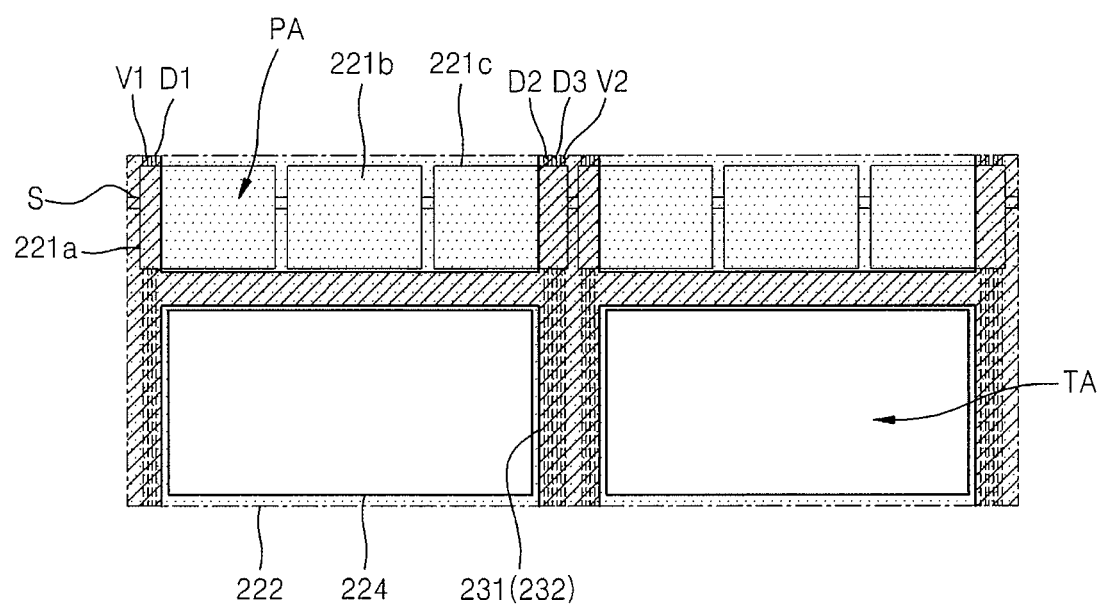
FIG. 13 is a schematic plan view showing the organic light-emitting unit of the organic light-emitting display device of FIG. 1, according to another embodiment of the present invention.

FIG. 13 illustrates the organic light-emitting unit 21 of the organic light-emitting display device of FIG. 1, according to another embodiment of the present invention. One transmitting region TA is formed to correspond to a first pixel electrode 221a, a second pixel electrode 221b, and a third pixel electrode 221c. First through third data lines D1, D2, and D3 are electrically coupled to the first pixel electrode 221a, the second pixel electrode 221b, and the third pixel electrode 221c, respectively. A first driving power line V1 is electrically coupled to the first and second pixel electrodes 221a and 221b, and a second driving power line V2 is electrically coupled to the third pixel electrode 221c.

In this structure, one large transmitting region TA is formed in three sub-pixels, for example, red (R), green (G), and blue (B) sub-pixels so that light transmittance in the transmitting regions TA may be further increased, and an image distortion effect due to light scattering may be further reduced.

The first transmission window 224 is formed in the opposite electrode 222 corresponding to the transmitting regions TA so that light transmittance in the transmitting regions TA may be further improved.

Even in this structure, a voltage drop in the opposite electrode 222 may be prevented by including the first conductive unit 231 and the second conductive unit 232.

Conductive lines, that is, the first driving power line V1, the second driving power line V2, the first data line D1, the second data line D2, and the third data line D3, may be covered by the first conductive unit 231 and the second conductive unit 232. Thus, an image distortion phenomenon may be further prevented or reduced.

As described above, according to embodiments of the present invention, a transparent organic light-emitting display device in which transmittance of external light is increased and a sheet resistance of an opposite electrode is reduced so as to reduce a voltage drop in the opposite electrode can be obtained.

Furthermore, a transparent organic light-emitting display device that prevents or reduces distortion of an image transmitted therethrough by preventing or reducing light transmitting therethrough from scattering can be obtained.

Although a first conductive unit and the opposite electrode may contact each other excessively to cause damage to the opposite electrode, a second conductive unit contacts the first conductive unit or the opposite electrode so that voltage drop in the opposite electrode can be prevented or reduced.

Furthermore, since the first conductive unit and the second conductive unit cover patterns of fine conductive lines formed in the transmitting regions, distortion of an external image transmitted therethrough can be prevented.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. An organic light-emitting display device comprising:
a first substrate having a transmitting region and a plurality of pixel regions separated from each other by the transmitting region interposed between the pixel regions;
a plurality of thin film transistors on the first substrate and being at the pixel regions of the substrate, respectively;
a passivation layer covering the plurality of thin film transistors;
a plurality of pixel electrodes on the passivation layer being electrically coupled to the thin film transistors, respectively, the plurality of pixel electrodes being at the pixel regions, respectively, and overlapping and covering the thin film transistors, respectively;
an opposite electrode facing the pixel electrodes and being at the transmitting region and the pixel regions;
an organic emission layer interposed between a corresponding one of the pixel electrodes and the opposite electrode for emitting light;
a second substrate facing the opposite electrode and being bonded to the first substrate;
a first conductive unit being interposed between the second substrate and the opposite electrode, opposite ends of the first conductive unit contacting the second substrate and the opposite electrode, respectively, and the first conductive unit comprising a conductive material; and
a second conductive unit located only outside of the pixel regions facing the first conductive unit and contacting the opposite electrode, the second conductive unit comprising a conductive material, the opposite electrode being interposed between the first conductive unit and the second conductive unit, and wherein the second conductive unit is formed directly under the first conductive unit.

2. The organic light-emitting display device of claim 1, wherein each of the pixel electrodes has an area substantially identical to that of a corresponding one of the pixel regions.

3. The organic light-emitting display device of claim 1, further comprising a plurality of conductive lines electrically coupled to the thin film transistors, respectively, wherein at least one of the conductive lines overlaps at least one of the pixel electrodes.

4. The organic light-emitting display device of claim 1, wherein a ratio of an area of the transmitting region with respect to a total area of the pixel regions and the transmitting region is between 5% and 90%.

5. The organic light-emitting display device of claim 1, wherein the passivation layer is on both the transmitting region and the pixel regions, and comprises a transparent material.

6. The organic light-emitting display device of claim 1, wherein at least portions of the first conductive unit and the second conductive unit overlap the transmitting region.

7. The organic light-emitting display device of claim 1, wherein the first conductive unit is on a surface of the second substrate that faces the opposite electrode.

8. The organic light-emitting display device of claim 1, further comprising an insulating layer on the passivation layer, the insulating layer covering edges of the pixel electrodes, wherein the second conductive unit is on the insulating layer.

9. The organic light-emitting display device of claim 1, wherein the opposite electrode has a transmission window in at least a portion of a region corresponding to the transmitting region, wherein the first conductive unit and the second conductive unit are adjacent to the transmission window.

10. The organic light-emitting display device of claim 1, wherein the pixel electrodes are reflective electrodes.

11. An organic light-emitting display device comprising:
a first substrate having a transmitting region and a plurality of pixel regions separated from each other by the transmitting region interposed between the pixel regions;
a plurality of pixel circuits on the first substrate, wherein each of the pixel circuits comprises at least one thin film transistor, and the plurality of pixel circuits are at the pixel regions, respectively;
a first insulating layer covering the pixel circuits;
a plurality of pixel electrodes on the first insulating layer being electrically coupled to the pixel circuits, respectively, and overlapping and covering the pixel circuits, respectively;
an opposite electrode facing the pixel electrodes and being at the transmitting region and the pixel regions;
an organic emission layer interposed between a corresponding one of the pixel electrodes and the opposite electrode for emitting light;
a second substrate facing the opposite electrode and being bonded to the first substrate;
a first conductive unit interposed between the second substrate and the opposite electrode having opposite ends contacting the second substrate and the opposite electrode, respectively, and the first conductive unit comprising a conductive material; and
a second conductive unit facing the first conductive unit and contacting the opposite electrode, the second conductive unit comprising a conductive material, the opposite electrode being interposed between the first conductive unit and the second conductive unit,
wherein the second conductive unit is discontinuous, and is only formed in the transmitting region; and
wherein the second conductive unit is formed directly under the first conductive unit.

12. The organic light-emitting display device of claim 11, wherein the corresponding one of the pixel electrodes is at a same region as a corresponding one of the pixel regions.

13. The organic light-emitting display device of claim 11, further comprising a plurality of conductive lines electrically coupled to the pixel circuits, respectively, wherein at least one of the conductive lines crosses at least one of the pixel regions.

14. The organic light-emitting display device of claim 11, wherein a ratio of an area of the transmitting region with respect to a total area of the pixel regions and the transmitting region is between 5% and 90%.

15. The organic light-emitting display device of claim 11, wherein the first insulating layer and a plurality of second insulating layers are on both the transmitting region and the pixel regions, and comprise a transparent material.

16. The organic light-emitting display device of claim 11, wherein at least portions of the first conductive unit and the second conductive unit overlap the transmitting region.

17. The organic light-emitting display device of claim 11, wherein the first conductive unit is on a surface of the second substrate that faces the opposite electrode.

18. The organic light-emitting display device of claim 11, further comprising a second insulating layer on the first insulating layer, the second insulating layer covering edges of the pixel electrodes, wherein the second conductive unit is on the second insulating layer.

19. The organic light-emitting display device of claim 11, wherein the opposite electrode has a transmission window formed in at least a portion of a region corresponding to the transmitting region, wherein the first conductive unit and the second conductive unit are adjacent to the transmission window.

20. The organic light-emitting display device of claim 11, wherein the pixel electrodes are reflective electrodes.

* * * * *